US00RE37335B1

(19) United States
(12) Reissued Patent
Sutardja et al.

(10) Patent Number: US RE37,335 E
(45) Date of Reissued Patent: Aug. 21, 2001

(54) RIPPLE CARRY LOGIC AND METHOD

(75) Inventors: Sehat Sutardja, Cupertino; Pantas Sutardja, San Jose, both of CA (US)

(73) Assignee: Marvell International Ltd., Hamilton (BM)

(21) Appl. No.: 09/585,343

(22) Filed: Jun. 2, 2000

Related U.S. Patent Documents

Reissue of:
(64) Patent No.: 5,764,718
Issued: Jun. 9, 1998
Appl. No.: 08/847,933
Filed: Apr. 28, 1997

(51) Int. Cl.[7] ..... G11C 19/00
(52) U.S. Cl. ..... 377/73; 377/49; 377/55; 377/78; 327/269; 327/270; 327/361
(58) Field of Search ..... 377/49, 55, 73, 377/78; 327/269, 270, 361

(56) References Cited

U.S. PATENT DOCUMENTS 5,481,582 * 1/1996 Ibenthal ..... 377/49
5,488,318 * 1/1996 Vajapey et al. ..... 377/73

* cited by examiner

*Primary Examiner*—Margaret R. Wambach
(74) *Attorney, Agent, or Firm*—Katten Muchin Zavis; Eric B. Janofsky

(57) ABSTRACT

Apparatus and method to logically process signals representative of multiple bits of multiple-bit numbers include successively delaying applications of the bit-representative signals to logical processing stages from associated input registers by a delay interval between input registers that is substantially equal to the processing delay interval per bit-level processing stage. In this way, successively more significant bits of each of plural numbers being logically processed are validly available for processing at each bit-level logic stage after a delay that is substantially equal to the processing delay interval of a preceding bit-level logic stage. Similarly, output registers for latching the logic output of each bit-level logic stage are clocked at successively delayed intervals substantially equal to the processing delay interval, and carry output from preceding logic stages are supplied to carry inputs of successive logic stages without additional delays following the processing delay interval of each preceding logic stage.

37 Claims, 1 Drawing Sheet

RIPPLE CARRY LOGIC AND METHOD

Matter enclosed in heavy brackets [ ] appears in the original patent but forms no part of this reissue specification; matter printed in italics indicates the additions made by reissue.

FIELD OF THE INVENTION

This invention relates to ripple-carry logic circuitry, and more specifically to method and apparatus for increasing the maximum achievable operating frequency of circuits employing ripple-carry logic elements.

BACKGROUND OF THE INVENTION

Conventional ripple-carry logic elements such as multipliers or adders of multi-bit applied numbers commonly impose delays in producing resultant outputs attributable to arrival at the ripple inputs at different time intervals of all the significant bits. Known attempts to circumvent such delays include performing partial arithmetic operations upon the significant bits of the numbers upon appearance at the inputs of the logic elements, and performing parallel processing of the multi-bit numbers buffered in input registers. Additionally, each significant bit of a number may be represented by other numbers (e.g., carry-save format), usually two-bits wide, for selective logic processing to reduce delays in producing the desired arithmetic logical output.

SUMMARY OF THE INVENTION

In accordance with the present invention, individual arithmetic logic stages that produce carry outputs for successive similar arithmetic logic stages each include input registers with substantially matching delay elements interposed between successive ones of the clock inputs of the registers for respective ones of the logic stages. In this manner, delays are attributable to successively latching the significant bits of input signal into respective input registers for the logic stages which are operable in substantially common clocking intervals to reduce overall effective delays in producing resultant arithmetic logical outputs.

DETAILED DESCRIPTION OF THE INVENTION

Figure 1:
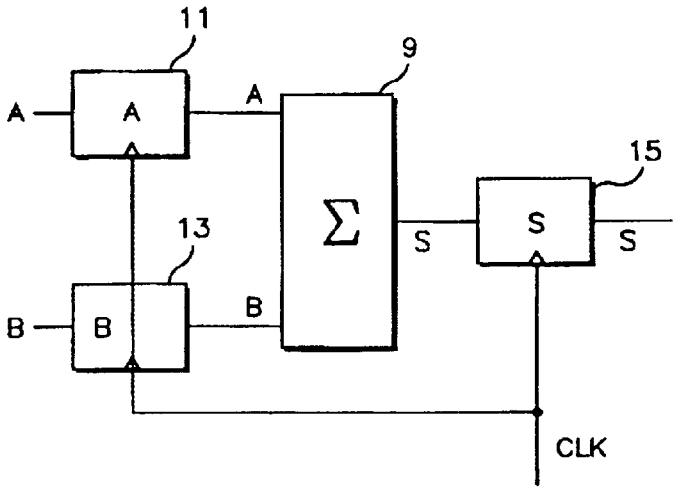
FIGURE 1 (PRIOR ART)
FIG. 1 is a block schematic diagram of conventional ripple-carry logic circuitry.

Referring now to FIG. 1, there is shown an arithmetic logic stage, such as a redundant adder 9 or other adder of conventional design such as a carry-shift added, or Manchester carry adder, or the like, having a plural number of inputs for the number n of significant bits applied thereto from each input register 11, 13. The resultant arithmetic logical output (e.g. the sum of A+B) of n bits is supplied to an output register 15 which may serve as an input register in a successive stage or logic level of concatenated arithmetic processing of plural numbers A, B . . . N.

Figure 2:
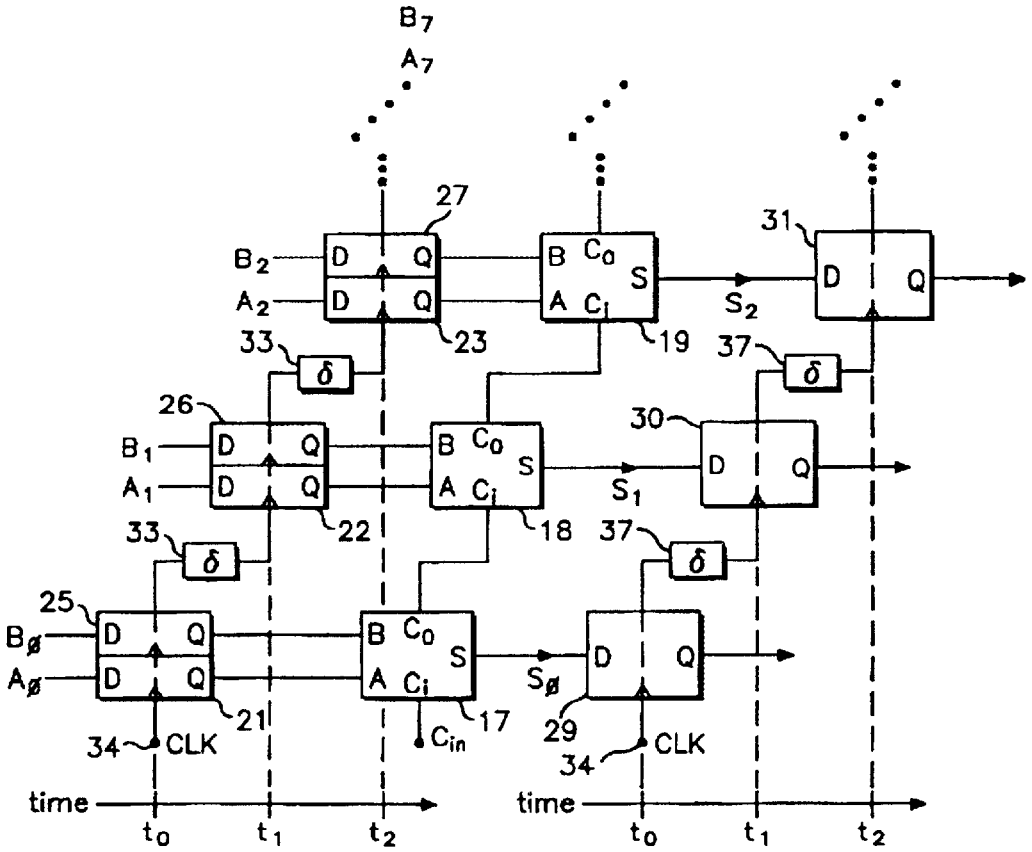
FIG. 2 is a block schematic diagram of ripple-carry logic circuitry according to the present invention.

Referring now to FIG. 2, there is shown a simplified block schematic diagram of one embodiment of the present invention in which a plurality of conventional ripple-carry logic stages (e.g. summing elements) 17–19 at one logic level of arithmetic processing are each disposed to receive respective significant bits $\phi$ . . . n of each input number A, B. Each logic stage 17–19 receives a carry input Ci to produce a resultant or summation output $S_\phi$, $S_1$ . . . $S_n$, and also provides a carry output $C_O$ for application to the successively more-significant bit-level logic stage. Each of the bit-level inputs $A_\phi$, $A_1$, . . . $A_n$ and $B_\phi$, $B_1$, . . . $B_n$ is supplied from a corresponding bit-level register 21–23 and 25–27 in which the bit-level signals are latched or stored in conventional matter. Each of the resultant or summation outputs $S_\phi$, $S_1$, . . . $S_n$ is supplied to corresponding bit-level output registers 29–31 to be latched or stored therein in conventional manner, all in an example of 8-bit logic operation. The output registers 29–31 may, of course, serve as input registers in a subsequent logic level of logic processing with additional multi-bit numbers X, Y . . . N in a similar manner as described herein. Each of the bit-level input registers 21–23 and 25–27, and output registers 29–31 are clocked in conventional manner, ideally from the same source (not shown) of clock signals 34. The clock signals per bit level are illustrated for convenience as being passed through or beyond each register forward the next bit-level register.

In accordance with one embodiment of the present invention, delay elements 33 are interposed between each of the bit-level input registers (and 37 between each output register 29–31, which may serve as input registers in a successive logic level). Each of the delay elements 33, 37 substantially approximates the delay interval (typically, one or two clock intervals) associated with each logic stage 17–19 to produce a logic carry output (and an overflow) for application to the next more-significant, bit-level logic stage 17–19. Such delay elements 33, 37 may each include an inverter in one embodiment of the invention. In general, an initial carry input (if any, for example, from a previous logic level) may be applied to the least significant bit-level logic stage 17.

In the manner described above, the delays through the input registers are substantially matched to the delays associated with the logic stages 17–19 in generating resultant carry outputs (if any) for application to the logic stages corresponding to the next more significant bit of multi-bit input numbers. This essentially limits the delays involved at one logic level of concatenated logic processing to the delays associated with successively latching the significant bits of the input numbers into the corresponding input registers, and to the additional delay interval of the arithmetic logical processing of the significant bits of each input number through the corresponding logic stages 17–19. As illustrated at the base of FIG. 2, clock signals to each bit-level register 25–27 and 29–31 are successively delayed ($t_1$, $t_2$, . . . ) from the initial clock input $t_\phi$ by the delay elements 33, 37 that are interposed in the clock lines between successive bit-level registers. Since the more significant bits are commonly not available, or are not valid until successively later intervals, the additional clock delay elements 33, 37 may be conveniently introduced in the manner previously described between the successive stages of the input registers 21–23 and 25–27 (and of the output registers 29–31) corresponding to the significant bits of the applicable numbers being arithmetically processed to thereby obviate problems commonly associated with conventional parallel-processing of the input numbers.

Therefore, the arithmetic logical processing apparatus and method according to the present invention provides incremental delays between the latching intervals of successive input registers corresponding to the significant bits of input numbers to be arithmetically processed. In this way, overall effective processing delays through such logic level of arithmetic processing are reduced compared with the total delays encountered through conventional ripple-carry logical processing of multi-bit input numbers requiring conventional carry look-ahead logic, or the like.

What is claimed is:

1. A logic circuit comprising:

a plurality of logic stages, each having plural signal inputs and a carry input for logically processing applied signals within a processing delay interval to produce an output representing selected significant bits of multi-bit numbers, and a carry output representing a logic overflow of the logically-processed applied signals;

a plurality of input registers for each of the multiple bits of multiple-bit numbers, each having a clock input and having an input for receiving a selected bit of a multi-bit number for supplying signal representative of the selected bit to an input of a corresponding logic stage in response to a clock signal applied to the clock input thereof; and a delay element connected between clock inputs of each of the input registers for each of the multiple-bit numbers to successively delay application of clock signals to the clock inputs of successively-oriented input registers for the selected bits of each of the multiple-bit numbers.

2. The logic circuit according to claim 1 wherein the delay elements delay application of clock signals to successively-oriented input registers by substantially the processing delay interval of the corresponding logic stage.

3. The logic circuit according to claim 1 wherein each of the carry outputs of each of the logic stages is supplied to a carry input of a successively-oriented logic stage substantially without delay.

4. The logic circuit according to claim 1 comprising:

a plurality of output registers, each having a clock input and having an input connected to receive an output from a corresponding logic stage and being operable in response to a clock signal applied thereto to latch the output of the corresponding logic stage; and a delay element connected between clock inputs of each of the output registers to successively delay application of clock signals to the clock inputs of successively-oriented output registers for latching therein selected bits of a multiple-bit number.

5. The logic circuit according to claim 4 wherein the delay elements delay application of clock signals to successively-oriented output registers by substantially the processing delay interval of the corresponding logic stage.

6. A method for processing a plurality of multi-bit numbers is a plurality of logic stages, each having plural signal inputs and a carry input for logically proceeding applied signals within a processing delay interval to produce an output representing selected significant bits of multi-bit numbers, and a carry output representing a logic overflow of the logically-processed applied signals, the method comprising:

latching a plurality of multiple bit signals representative of multiple-bit numbers for selective application when clocked to a corresponding logic stage;

supplying a carry output from a logic stage to a carry input of a successive logic stage following a processing delay interval; and selectively delaying substantially by the processing delay interval the clocking of the latched multiple bit signals to the logic stages to successively delay logic processing of the applied signals to produce associated output and carry output within a processing delay interval in each logic stage.

7. The method according to claim 6 comprising:

latching the output of each logic stage for selective access when clocked; and successively delay the clocking of access to each latched logic stage output substantially by the processing delay interval to accumulate latched outputs representative of a multiple bit number after a plural number of processing delay intervals.

*8. A logic circuit comprising:*

*a plurality of logic stages, each having plural signal inputs and a carry input for logically processing applied signals within a processing delay interval to produce an output representing selected significant bits of multi-bit numbers, and a carry output representing a logic overflow of the logically-processed applied signals;*

*a plurality of output registers, each having a clock input and having an input connected to receive an output from a corresponding logic stage and being operable in response to a clock signal applied thereto to latch the output of the corresponding logic stage; and*

*a delay element connected between clock inputs of each of the output registers to successively delay application of clock signals to the clock inputs of successively-oriented output registers for latching therein selected bits of a multiple-bit number.*

*9. The logic circuit according to claim 8 wherein the delay elements delay application of clock signals to successively-oriented output registers by substantially the processing delay interval of the corresponding logic stage.*

*10. The logic circuit according to claim 8 wherein each of the carry outputs of each of the logic stages is supplied to a carry input of a successively-oriented logic stage substantially without delay.*

*11. The logic circuit according to claim 8 further comprising:*

*a plurality of input registers for each of the multiple bits of multiple-bit numbers, each having a clock input and having an input for receiving a selected bit of a multi-bit number for supplying a signal representative of the selected bit to an input of a corresponding logic stage in response to a clock signal applied to the clock input thereof; and*

*a delay element connected between clock inputs of each of the input registers for each of the multiple-bit numbers to successively delay application of clock signals to the clock inputs of successively-oriented input registers for the selected bits of each of the multiple-bit numbers.*

*12. The logic circuit according to claim 11 wherein the delay elements delay application of clock signals to successively-oriented output registers by substantially the processing delay interval of the corresponding logic stage.*

*13. A method for processing a plurality of multi-bit numbers in a plurality of logic stages, each having plural signal inputs and a carry input for logically processing applied signals within a processing delay interval to produce an output representing selected significant bits of multi-bit numbers, and a carry output representing a logic overflow of the logically-processed applied signals, the method comprising the steps of:*

*latching the output of each logic stage for selective access when clocked;*

*supplying a carry output from a logic stage to a carry input of a successive logic stage following a processing delay interval; and*

*successively delaying the clocking of access to each latched logic stage output substantially by the processing delay interval to accumulate latched outputs representative of a multiple bit number after a plural number of processing delay intervals.*

*14. The method according to claim 13 further comprising:*

*latching a plurality of multiple bit signals representative of multiple-bit numbers for selective application when clocked to a corresponding logic stage; and*

*selectively delaying substantially by the processing delay interval the clocking of the latched multiple bit signals to the logic stages to successively delay logic processing of the applied signals to produce associated output and carry output within a processing delay interval in each logic stage.*

*15. A logic circuit comprising:*

*a plurality of logic stages, each having (i) at least one signal input and (ii) a carry input, each logic stage logically processing at least one applied signal received on said signal input within a processing delay interval to produce (i) an output corresponding to the logically-processed applied signal and (ii) a carry output representing a logic overflow of the logically-processed applied signal;*

*a plurality of logical devices respectively coupled to said plurality of logic stages, each logical device processing at least one of (i) a signal corresponding to the at least one applied signal of the corresponding logic stage and (ii) a signal corresponding to the logically-processed applied signal of the corresponding logic stage, each of said plurality of logical devices having a clock input and processing the at least one of (i) the signal corresponding to the at least one applied signal of the corresponding logic stage and (ii) the signal corresponding to the logically-applied signal of the corresponding logic stage, in response to a clock signal applied to said clock input; and*

*a plurality of delay elements respectively coupled to clock inputs of the plurality of logical devices to delay application of a clock signal to the clock inputs of the plurality of logical devices.*

*16. A circuit according to claim 15, wherein each delay element delays the application of the clock signal by a delay which corresponds to the processing of the at least one applied signal by the corresponding logic stage.*

*17. A circuit according to claim 16, wherein each delay element delays the application of the clock signal by a delay which corresponds to a time required for the corresponding logic stage to produce a logic carry output.*

*18. A circuit according to claim 15, wherein each of the plurality of logic stages provides its carry output to a carry input of a subsequent logic stage.*

*19. A circuit according to claim 15, wherein each of the plurality of logic stages comprises an arithmetic adder.*

*20. A circuit according to claim 19, wherein each of the plurality of logic stages comprises a ripple-carry adder.*

*21. A circuit according to claim 15, wherein each of the plurality of logic stages outputs a summation signal corresponding to the at least one applied signal and the carry input.*

*22. A circuit according to claim 15, wherein the plurality of logical devices comprises a plurality of input registers which (i) input successive bits of a multi-bit number and (ii) output a signal corresponding to the significant bits of the multi-bit number, at least one of said plurality of logical devices providing a carry output which corresponds to the logical processing by said at least one of said plurality of logical devices.*

*23. A circuit according to claim 22, wherein each of the plurality of input registers comprises a bit-level register.*

*24. A circuit according to claim 15, wherein the plurality of logical devices comprises a plurality of output registers each of which processes a signal corresponding to the logically-processed applied signal of the corresponding logic stage.*

*25. A circuit according to claim 24, wherein each of the plurality of output registers comprises a bit-level register which receive a summation signal from a corresponding logic stage.*

*26. A circuit according to claim 15, wherein said plurality of logic stages and said plurality of logical devices are disposed in a cascade arrangement.*

*27. A circuit according to claim 15, wherein said plurality of logical devices comprise:*

*a plurality of input logical devices respectively coupled to said plurality of logic stages, each of said plurality of input logical devices processing a signal corresponding to the at least one applied signal of the corresponding logic stage, each of said plurality of input logical devices having a first clock input and processing the signal corresponding to the at least one applied signal of the corresponding logic stage in response to a clock signal applied to said first clock input; and*

*a plurality of output logical devices respectively coupled to said plurality of logic stages, each of said plurality of output logical devices processing a signal corresponding to the logically-processed applied signal of the corresponding logic stage, each of said plurality of output logical devices having a second clock input and processing the signal corresponding to the logically-applied signal of the corresponding logic stage in response to a clock signal applied to said second clock input.*

*28. A method of operating a logic circuit, comprising the steps of:*

*processing a multi-value signal in a plurality of logic stages, each logic stage processing (i) at least one applied signal of the multi-value signal and (ii) a carry input, each logic stage logically processing the at least one applied signal within a processing delay interval to produce (i) an output corresponding to the logically-processed applied signal and (ii) a carry output representing a logic overflow of the logically-processed applied signals;*

*processing signals in a plurality of logical devices respectively coupled to said plurality of logic stages, each logical device processing at least one of (i) a signal corresponding to the at least one applied signal of the corresponding logic stage and (ii) a signal corresponding to the logically-processed applied signal of the corresponding logic stage, each of said plurality of logical devices having a clock input and processing the at least one of (i) the signal corresponding to the at least one applied signal of the corresponding logic stage and (ii) the signal corresponding to the logically-applied signal of the corresponding logic stage, in response to a clock signal applied to said clock input; and*

*delaying, in a plurality of delay elements respectively coupled to clock inputs of the plurality of logical devices, application of clock signals to the clock inputs of the plurality of logical devices.*

*29. A method according to claim 28, wherein, in the delay step, each delay element delays the application of the clock signal by a delay which corresponds to the processing of the at least one applied signal by the corresponding logic stage.*

*30. A method according to claim 28, wherein, in the delay step, each delay element delays the application of the clock signal by a delay which corresponds to a time required for the corresponding logic stage to produce a logic carry output.*

*31. A method according to claim 28, wherein, in the step of processing the multi-value signal, each of the plurality of logic stages provides its carry output to a carry input of a subsequent logic stage.*

*32. A method according to claim 28, wherein, in the step of processing the multi-value signal, each of the plurality of logic stages outputs a summation signal corresponding to the at least one applied signal and the carry input.*

*33. A method according to claim 28, wherein, in the step of processing signals, the plurality of logical devices uses a plurality of input registers which (i) input successive bits of a multi-bit number and (ii) output a signal corresponding to the significant bits of the multi-bit number, at least one of said plurality of logical devices providing a carry output which corresponds to the logical processing by said at least one of said plurality of logical devices.*

*34. A method according to claim 28, wherein, in the step of processing signals, the plurality of logical devices uses a plurality of output registers each of which processes a signal corresponding to the logically-processed applied signal of the corresponding logic stage.*

*35. A method according to claim 34, wherein, in the step of processing signals, each of the plurality of output registers comprises a bit-level register which receives a summation signal from a corresponding logic stage.*

*36. A method according to claim 28, wherein said multi-value signal is cascade-processed through said plurality of logic stages and said plurality of logical devices.*

*37. A method according to claim 28, wherein the step of processing the multi-value signals comprises the steps of:*

*processing input multi-value signals in a plurality of input logical devices respectively coupled to said plurality of logic stages, each of said plurality of input logical devices processing a signal corresponding to the at least one applied signal of the corresponding logic stage, each of said plurality of input logical devices having a first clock input and processing the signal corresponding to the at least one applied signal of the corresponding logic stage in response to a clock signal applied to said first clock input; and*

*processing output signals in a plurality of output logical devices respectively coupled to said plurality of logic stage, each of said plurality of output logical device processing a signal corresponding to the logically-processed applied signal of the corresponding logic stage, each of said plurality of output logical devices having a second clock input and processing the signal corresponding to the logically-applied signal of the corresponding logic stage in response to a clock signal applied to said second clock input.*

* * * * *